United States Patent
Akram

[19]

[11] Patent Number: 6,064,116
[45] Date of Patent: *May 16, 2000

[54] DEVICE FOR ELECTRICALLY OR THERMALLY COUPLING TO THE BACKSIDES OF INTEGRATED CIRCUIT DICE IN CHIP-ON-BOARD APPLICATIONS

[75] Inventor: Salman Akram, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/870,614

[22] Filed: Jun. 6, 1997

[51] Int. Cl.[7] .......................... H01L 23/34; H01L 23/053; H01L 23/48; H01L 23/52

[52] U.S. Cl. .................. 257/723; 257/700; 257/758; 257/782; 361/761; 361/780; 361/790; 361/794

[58] Field of Search ..................... 257/723, 700, 257/758, 782, 686; 361/736, 761, 780, 790, 794

[56] References Cited

U.S. PATENT DOCUMENTS

| | | | |
|---|---|---|---|
| 4,038,488 | 7/1977 | Lin | 257/723 |
| 4,283,755 | 8/1981 | Tracy | 361/393 |
| 4,578,697 | 3/1986 | Takemae | 257/723 |
| 4,729,061 | 3/1988 | Brown | 361/386 |
| 4,903,114 | 2/1990 | Aoki et al. | 257/723 |
| 5,138,436 | 8/1992 | Koepf | 257/723 |
| 5,311,396 | 5/1994 | Steffen | 361/736 |
| 5,497,027 | 3/1996 | Crafts | 257/528 |
| 5,768,109 | 6/1998 | Gulick et al. | 361/794 |

*Primary Examiner*—Teresa M. Arroyo
*Attorney, Agent, or Firm*—Trask, Britt & Rossa

[57] ABSTRACT

An inventive printed circuit board for chip-on-board applications has a ground plane that is externally exposed through apertures in any overlying layers in the board so the backside surface of a bare integrated circuit die can be directly attached to the ground plane using a silver-filled epoxy. As a result, heat is conducted away from the die through the ground plane. Also, a substrate bias voltage can be supplied to the backside surface of the die through the ground plane to eliminate the need for an internal substrate bias to the die, and to eliminate the need for a substrate bias voltage bond pad on the front-side surface of the die.

17 Claims, 5 Drawing Sheets

DEVICE FOR ELECTRICALLY OR THERMALLY COUPLING TO THE BACKSIDES OF INTEGRATED CIRCUIT DICE IN CHIP-ON-BOARD APPLICATIONS

BACKGROUND

1. Field of the Invention

This invention relates in general to chip-on-board applications for integrated circuit dice, and in particular to devices and methods for electrically and thermally coupling to the backsides of dice in such applications.

2. State of the Art

Integrated circuit (IC) dice or "chips" are small, generally rectangular IC devices cut from semiconductor wafers, such as silicon wafers, on which multiple IC's have been fabricated. Most dice are packaged by attaching them to lead frames supported in plastic or ceramic packages, and the lead frames and packages are typically designed to conduct heat away from the dice in order to protect them from heat damage. Such packages are also typically designed to protect the dice from corrosion.

Some dice, however, are packaged in what are known as "chip-on-board" (COB) applications, in which the dice are directly attached to printed circuit boards (PCB's) or other known substrates using well-known die-attach techniques. In these applications, bond pads on one or more dice are connected to signal traces on the surfaces of PCB's or other substrates using wire, or tape-automated, bonding, and a liquid or gel encapsulant, commonly referred to as a "glob top," is applied over the dice to protect them from corrosion. One such COB application is described in U.S. Pat. No. 5,497,027.

Dice in COB applications typically generate more heat than their associated PCB's alone can satisfactorily conduct away. Consequently, certain techniques have been devised to assist in conducting heat away from dice in COB applications. In one such technique shown in FIG. 1, circuit traces 10 that widen near a die 12 and are directly attached to the surface 14 of a PCB 16 assist the PCB 16 in conducting significant amounts of heat away from the die 12. Unfortunately, circuit traces that widen sufficiently near dice to satisfactorily conduct heat away from the dice typically use an inordinately large amount of surface space on their associated PCB's. As a result, widened circuit traces can be difficult or impossible to implement in today's densely packed COB applications. Widened circuit traces can also lead to an undesirable increase in capacitive and inductive parasitics, which are highly undesirable for high-speed applications.

Another technique for conducting heat away from dice in COB applications involves using thermally conductive PCB's in place of the more commonly used glass-epoxy PCB's. Thermally conductive PCB's are made with materials such as insulated aluminum, porcelainized steel, and ceramics that are superior in heat transfer characteristics than glass-epoxy. Because this technique is not applicable to the glass-epoxy PCB's used in the majority of COB applications, it is of limited utility.

Therefore, there is a need in the art for a device and method for satisfactorily conducting heat away from dice that are directly attached to a variety of PCT'S, including conventional, widely-utilized glass-epoxy PCB's, without degrading the electrical characteristics of the interconnecting circuitry in COB applications.

SUMMARY OF THE INVENTION

An inventive device for chip-on-board applications comprises a base, such as a printed circuit board (PCB) or a multi-chip module, that includes a conductive layer, such as a copper or other metallic plane, positioned on a surface of a supporting insulative substrate. An insulating layer overlies the surface of the conductive layer and defines at least one aperture in substantial registry with a localized region on the conductive layer on which a bare integrated circuit die is to be placed. The backside surface of the die is directly attached to the conductive plane in the localized region using a conductive die-attach material, such as a silver-filled epoxy, interposed between the conductive layer and the die. The inventive device thus can advantageously conduct heat away from the die by directly coupling the backside of the die to the conductive layer through the conductive die-attach material. The device can also conduct a substrate bias voltage to the backside of the die through the conductive layer and the die-attach material.

In a modified version of the base described above, the base includes multiple vertically-separated conductive layers, each layer having a localized region for conductive attachment to one of multiple bare integrated circuit dice. As a result, each of the dice may receive a different substrate bias voltage through its respective conductive layer.

In another embodiment of the present invention, an electronic device includes the base described above and an integrated circuit die, such as a Dynamic Random Access Memory (DRAM) die. In still another embodiment, an electronic system includes input, output, memory, and processor devices, and one or more of these devices includes the base described above.

In a further embodiment, a system for conducting heat away from a die includes a thermally conductive interior PCB layer having a surface with an externally accessible die-attach region. A thermally conductive die-attach material directly attaches a backside surface of the die to the die-attach region to establish thermal conduction between the die and the thermally conductive layer.

In a still further embodiment of the present invention, a system for supplying a substrate bias voltage to a die includes a substrate bias voltage generator and an electrically conductive layer inside a PCB for conducting the substrate bias voltage to an externally accessible die-attach region on the surface of the conductive layer. An electrically conductive die-attach material directly attaches a backside surface of the die to the die-attach region to conduct the substrate bias voltage to the backside surface of the die.

DETAILED DESCRIPTION OF THE PREFERRED EMBODIMENTS

Figure 1:
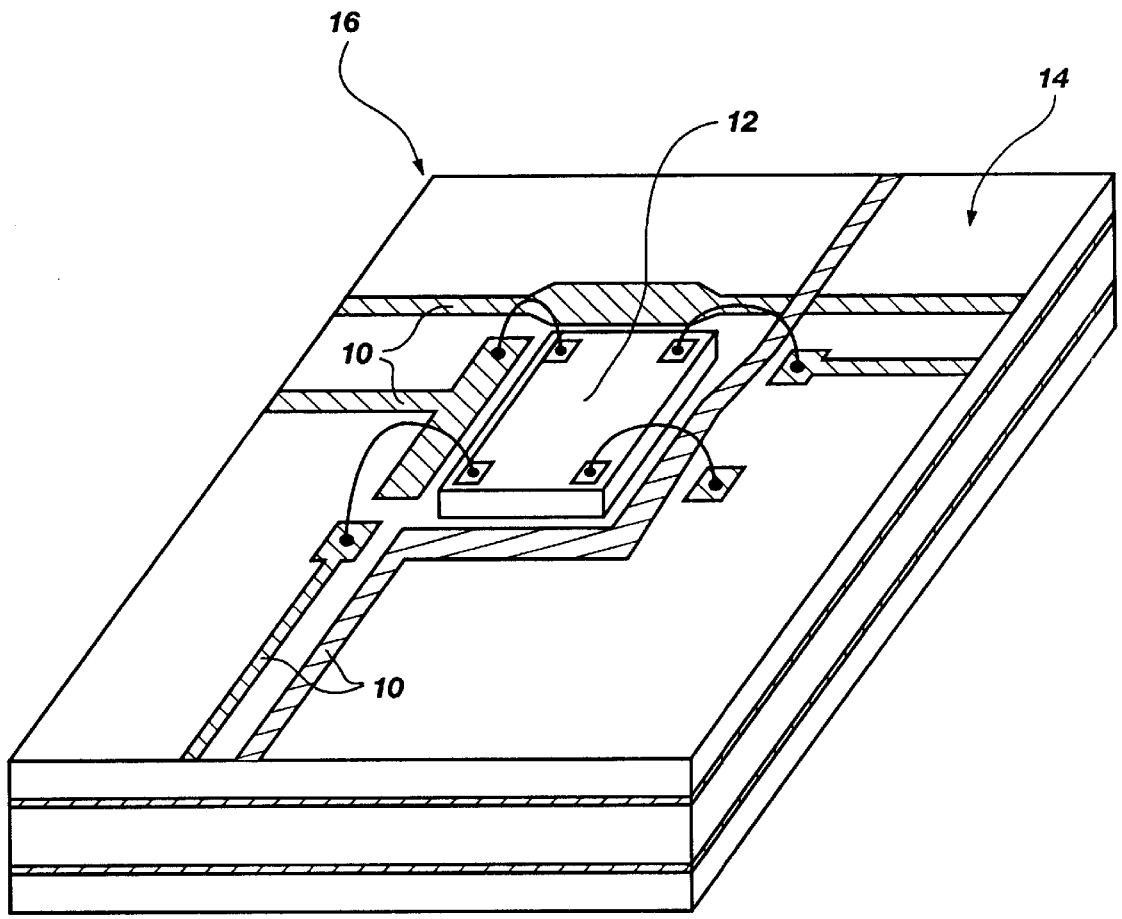
FIG. 1 is an isometric view of a portion of a prior art printed circuit board that uses widened circuit traces near a directly attached (i.e., "on-board") integrated circuit die to conduct heat away from the die.
Figure 2:
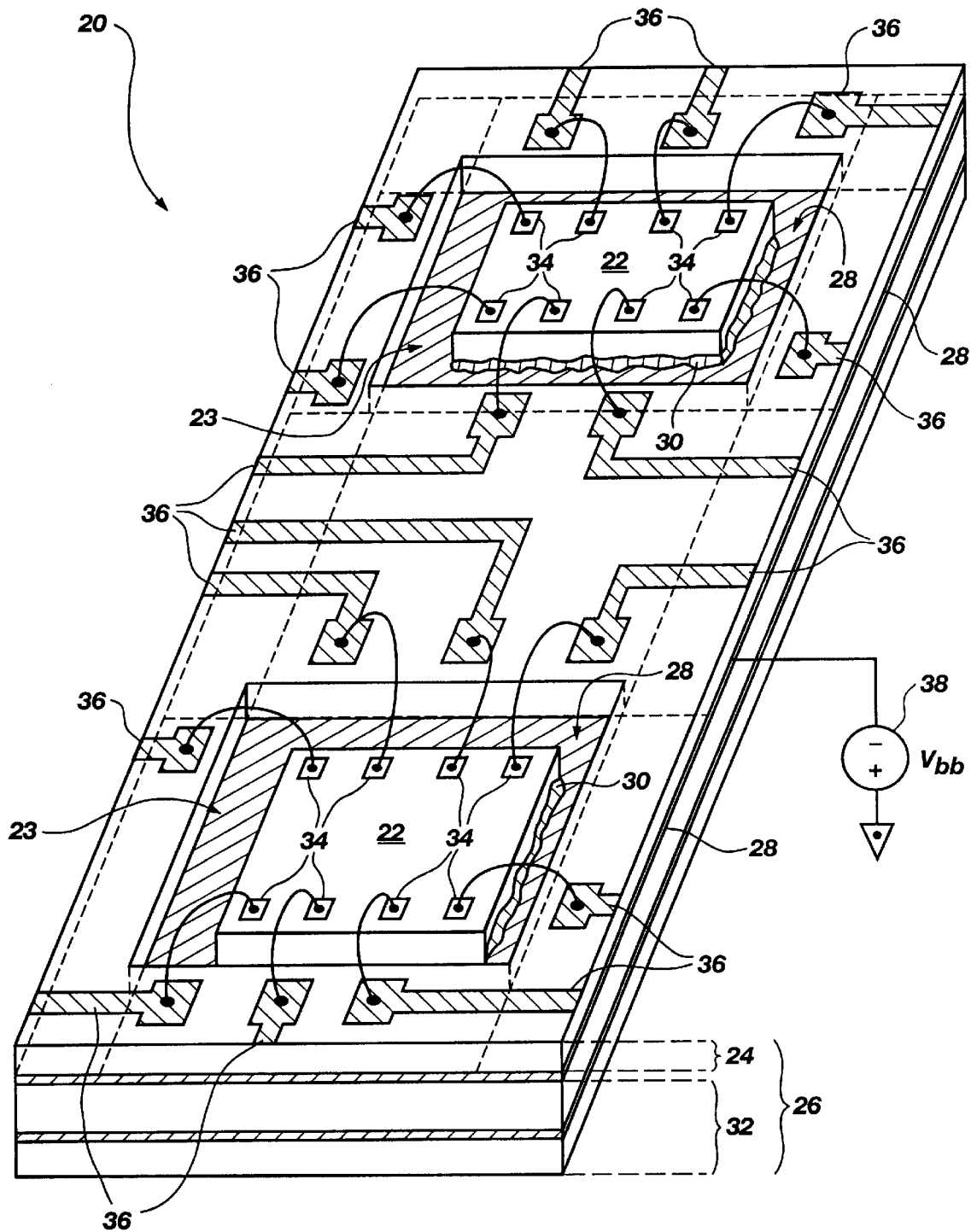
FIG. 2 is an isometric view of a portion of a multi-chip module including integrated circuit dice directly attached at their backsides to a conductive layer of a base, such as a printed circuit board, in order to effect direct electrical and thermal conduction between the conductive layer and the dice in accordance with the present invention.

As shown in FIG. 2, the present invention comprises a multi-chip module 20 that includes a plurality of integrated circuit dice 22, each recessed in an aperture 23 in an insulating layer 24 of an insulative base 26. The base 26 may comprise an FR-4 glass-epoxy printed circuit board (PCB) or other PCB, the term PCB as employed herein including conductor-carrying substrates of silicon, ceramic, polymers and other materials known in the art. Although the present invention will be described with respect to multi-chip module embodiments, it will be understood by those having skill in the field of this invention that the present invention is also applicable to single-die applications employing PCB's or other conductor-carrying bases. It will also be understood that the present invention is applicable to memory dice, such as Dynamic Random Access Memory (DRAM) dice, packaged in Single In-line Memory Modules (SIMM's), Dual In-line Memory Modules (DIMM's), and memory cards, as well as to processors and other dice commonly employed singly and in multi-chip assemblies on a variety of conductor carrying substrates.

Backsides (not shown) of the dice 22 are directly attached in a chip-on-board (COB) application to a conductive layer 28 of the base 26 using a conductive die-attach material 30, such as a eutectic solder (e.g., a gold/silver eutectic), a metal-filled epoxy (e.g., a silver-filled epoxy), or a conductive polyamide adhesive. Also, the conductive layer 28 is positioned on a substrate 32 that may comprise one or more PCB layers. It will be understood that the conductive die-attach material and the conductive layer may be thermally conductive, electrically conductive, or preferably both, and that the conductive layer may comprise a wide variety of conductive materials, including copper, gold, and platinum. It should also be understood that there may be more than one vertically-superimposed conductive layer in a base and, consequently, that different dice may be attached to different conductive layers in the same base through apertures 23 extending to different depths of base 26.

Bond pads 34 on front- or active-side surfaces of the dice 22 are wire-bonded to signal traces 36 carried on a surface of the insulating layer 24. Of course, the bond pads 34 may also be bonded to the signal traces 36 using tape-automated bonding (TAB) techniques, wherein the conductors are carried on a flexible dielectric film. Also, the signal traces 36 may comprise a wide variety of conductors, including, without limitation, copper, gold, and platinum. Further, it should be understood that, while the multi-chip module 20 of FIG. 2 is shown as having a single insulating layer 24 between the conductive layer 28 and the signal traces 36, the present invention is equally applicable to COB applications in which there are multiple superimposed layers, such as insulating, conductive, or signal layers, between a conductive layer to which the backside of a die is directly attached and the signal layer to which the front-side of each die is bonded.

Because the present invention directly attaches the backsides of dice to a conductive layer, heat from the dice is advantageously conducted away from the dice through the conductive layer. Also, as shown in FIG. 2, a substrate bias voltage generator 38 can supply a substrate bias voltage $V_{bb}$ to the backsides (not shown) of the dice 22 through the conductive layer 28. As a result, there is no need for on-board substrate bias voltage generators (not shown) in the dice 22, and there is no need to supply the substrate bias voltage $V_{bb}$ to the dice 22 through bond pads 34 on their front-side surfaces. Of course, a supply voltage (commonly designated $V_{cc}$), ground potential (commonly designated $V_{ss}$), or electronic signal may be supplied to the dice 22 through the conductive layer 28 in place of the substrate bias voltage $V_{bb}$. Also, although the generator 38 is shown in FIG. 2 as applying a negative substrate bias voltage $V_{bb}$ to the conductive layer 28, it should be understood that the generator 38 may instead provide a positive substrate bias voltage $V_{bb}$ to the layer 28.

The present invention also provides marginally greater physical protection for dice by positioning them within a protective aperture in the thin upper insulating layer 24. Further, the present invention advantageously allows incrementally shorter bond wires to be used during die-bond because the front-side surfaces of the dice are slightly closer to the level of the signal traces to which they are bonded. While such advantages are relatively small, they are nonetheless significant.

Figure 3:
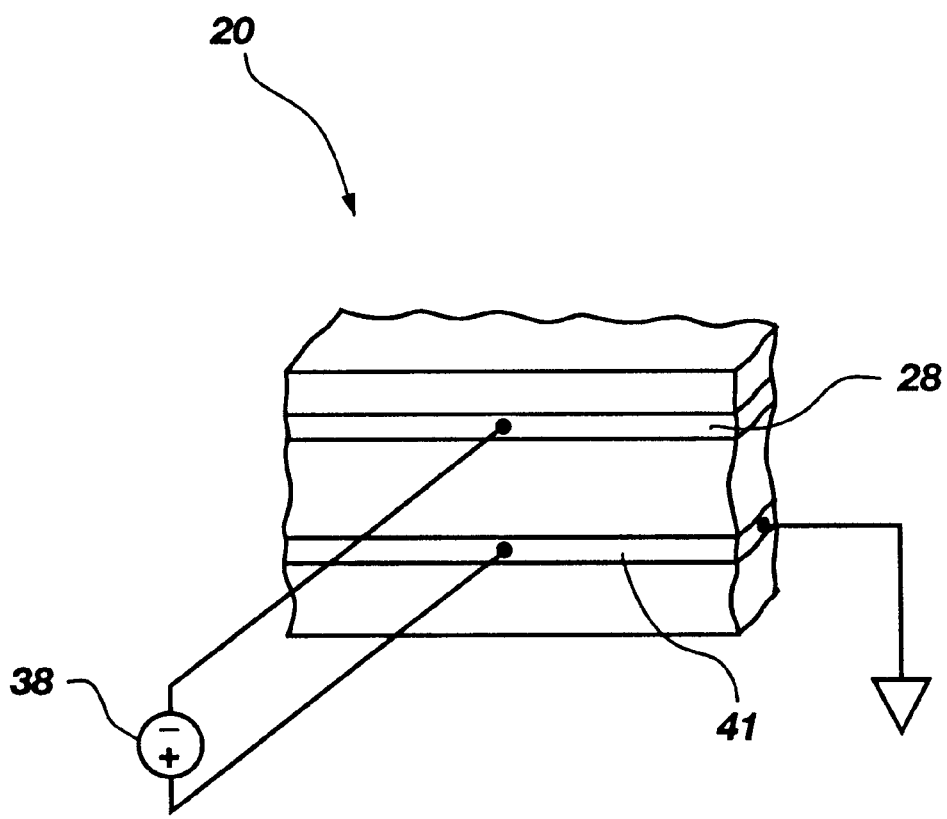
FIG. 3 is an isometric sectional view of the multi-chip module portion of FIG. 2 with an alternative substrate biasing arrangement.

As shown in a sectional view in FIG. 3, an alternative version of the multi-chip module 20 of FIG. 2 includes the substrate bias voltage generator 38 directly applying a bias between the conductive layer 28 and a conductive reference layer 41. Of course, while the reference layer 41 is shown in FIG. 3 as being grounded, it may be coupled to any voltage, particularly other reference voltages.

Figure 4:
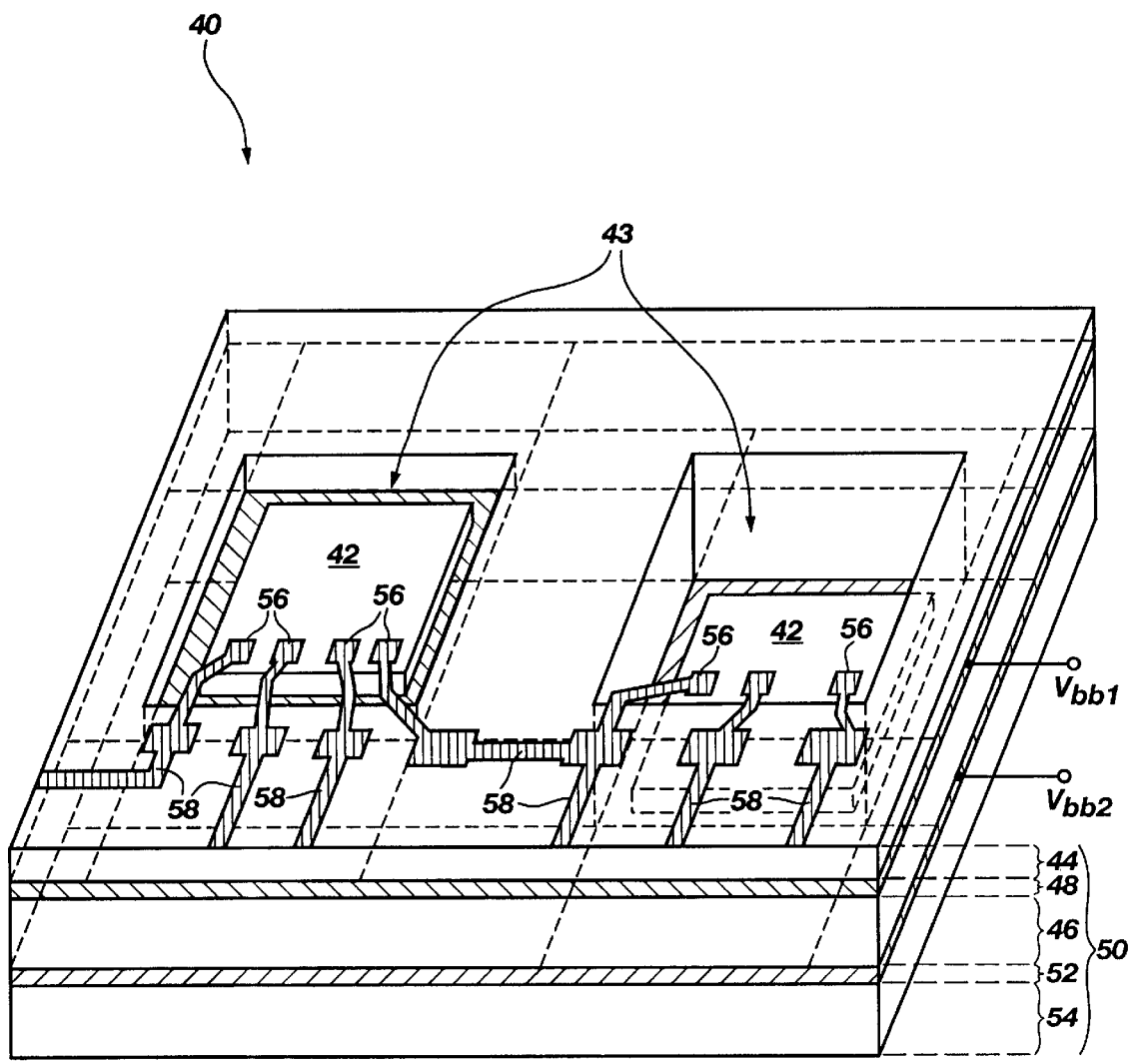
FIG. 4 is an isometric view of a portion of a multi-chip module including integrated circuit dice directly attached at their backsides to multiple conductive layers of a base, such as a printed circuit board, in order to effect direct electrical and thermal conduction between each die and one of the conductive layers in accordance with the present invention.

As shown in FIG. 4, the present invention also comprises a multi-chip module 40 that includes a plurality of integrated circuit dice 42, each recessed in an aperture 43 in at least one of insulating layers 44 and 46 and in one instance extending through a first conductive layer 48 of an insulative base 50. The base 50 may comprise an FR-4 glass-epoxy printed circuit board (PCB) or other PCB.

Backsides (not shown) of the dice 42 are directly respectively attached in a chip-on-board (COB) application to the first conductive layer 48 and a second conductive layer 52 of the base 50 using a conductive die-attach material (not shown), such as a eutectic solder (e.g., a gold/silver eutectic), a metal-filled epoxy (e.g., a silver-filled epoxy), or a conductive polyamide adhesive. Also, the second conductive layer 52 is positioned on a substrate 54 that may comprise one or more PCB layers. It will be understood that the conductive die-attach material and the conductive layers may be thermally conductive, electrically conductive, or preferably both, and that the conductive layers may comprise a wide variety of conductive materials, including copper, gold, and platinum.

Bond pads 56 on front- or active-side surfaces of the dice 42 are Tape-Automated Bonded (TAB) to signal traces 58 carried on a surface of the insulating layer 44. Of course, the signal traces may comprise a wide variety of conductors, including, without limitation, copper, gold, and platinum. The flexible film (usually polyimide) of the TAB tape has been deleted for clarity.

Because the present invention directly attaches the backsides of dice to conductive layers, heat from the dice is advantageously conducted away from the dice through the conductive layers. Also, substrate bias voltage generators (not shown) can supply a first substrate bias voltage $V_{bb1}$ to the backside (not shown) of one of the dice 42 through the first conductive layer 48 and a second substrate bias voltage $V_{bb2}$ to the backside (not shown) of the other of the dice 42 through the second conductive layer 52. As a result, there is no need for on-board substrate bias voltage generators in the dice 42, and there is no need to supply the substrate bias voltages $V_{bb1}$ and $V_{bb2}$ to the dice 42 through bond pads 56 on their front-side surfaces. Of course, a supply voltage $V_{cc}$, ground potential $V_{ss}$, or electronic signal may be supplied to the dice 42 through the conductive layers 48 and 52 in place of the substrate bias voltages $V_{bb1}$ and $V_{bb\ 2}$. Also, the substrate bias voltages $V_{bb}$ and $V_{bb2}$ can be different voltages.

Figure 5:
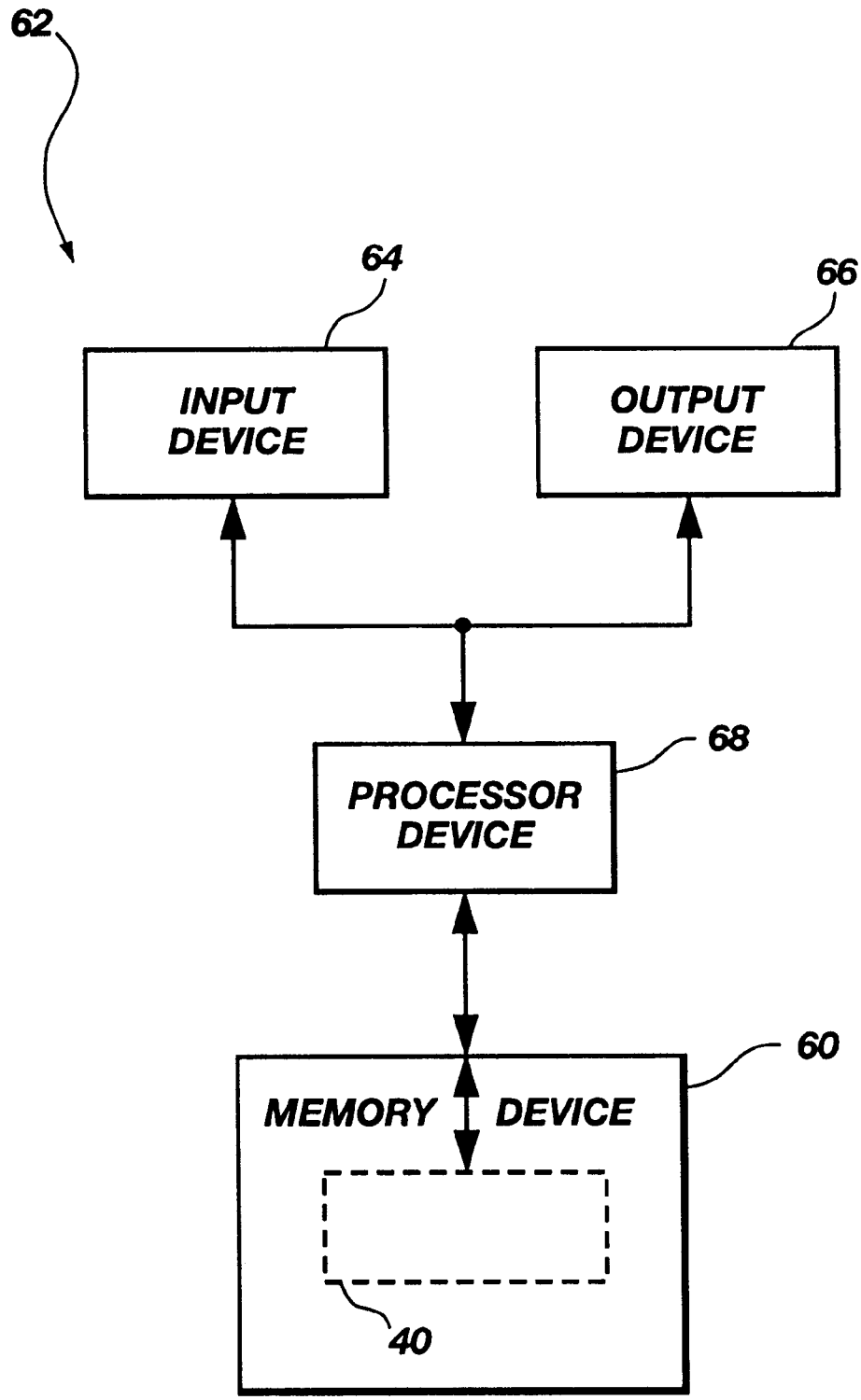
FIG. 5 is a block diagram of an electronic system including the multi-chip module of FIG. 4.

As shown in FIG. 5, the multi-chip module 40 of FIG. 4 can be incorporated into a memory device 60 of an electronic system 62, such as a computer system, that includes an input device 64 and an output device 66 coupled to a processor device 68. Of course, the multi-chip module 40 can alternatively be incorporated into the input device 64, the output device 66, or the processor device 68. Alternatively, the multi-chip module (not shown) of FIG. 2 may be incorporated into the input device 64, output device 66, processor device 68, or memory device 60. Also, the memory device 60 of FIG. 5 may comprise a DIMM, SIMM, memory card or any other memory die-carrying substrate.

Although the present invention has been described with reference to particular embodiments, the invention is not limited to these described embodiments. Rather, the invention is limited only by the appended claims, which include within their scope all equivalent devices or methods which operate according to the principles of the invention as described.

What is claimed is:

1. A base for supporting at least two bare integrated circuit dice facing the same direction, the base comprising:

a supporting substrate;

a first conductive layer positioned adjacently above the supporting substrate and including at least one localized region for direct conductive attachment by a conductive die-attach material to a backside surface of at least one die of the at least two bare integrated circuit dice;

a first insulating layer positioned adjacently above the first conductive layer, the first insulating layer having at least one aperture therethrough to further define the at least one localized region of the first conductive layer and to receive at least one of the at least two bare integrated circuit dice;

a second conductive layer positioned adjacently above the first insulating layer in a substantially parallel relationship therewith and positioned substantially parallel to and vertically-spaced apart from the first conductive layer, the second conductive layer including at least one other localized region for direct conductive attachment to a backside surface of at least one other die of the at least two bare integrated circuit dice by a conductive die-attach material, the second conductive layer further having at least one aperture extending therethrough and being substantially vertically aligned with the at least one aperture in the first insulating layer; and a second insulating layer positioned adjacently above the second conductive layer, the second insulating layer having at least two other apertures therethrough, one of the at least two other apertures further defining the at least one other localized region of the second conductive layer and receiving the at least one other die of the at least two bare integrated circuit dice, the second of the at least two other apertures being substantially vertically aligned with and in communication with the at least one aperture extending through the second conductive layer and with the at least one aperture extending through the first insulating layer further defining the at least one localized region of the first conductive layer.

2. The base of claim 1, further comprising a signal layer connected to the second insulating layer in a substantially parallel relationship therewith, the signal layer including a plurality of terminals for electrical connection to front-side surfaces of the at least two bare integrated circuit dice.

3. The base of claim 2, wherein the signal layer is selected from a group comprising copper, gold, and platinum.

4. The base of claim 1, wherein the signal layer comprises a plurality of signal traces.

5. The base of claim 2, wherein at least a portion of the signal layer lies generally adjacent a periphery of the at least one localized region of at least one of the conductive layers.

6. The base of claim 2, wherein the signal layer terminals comprise bond pads.

7. The base of claim 1, wherein the supporting substrate comprises one or more printed circuit board layers selected from a group comprising conductive and insulative layers.

8. The base of claim 7, wherein the one or more printed circuit board layers comprise glass-epoxy printed circuit board layers.

9. The base of claim 8, wherein the one or more glass epoxy printed circuit board layers comprise FR-4 glass-epoxy printed circuit board layers.

10. The base of claim 1, wherein at least one conductive layer is selected from a group comprising copper, gold, and platinum.

11. The base of claim 1, wherein the second conductive layer is positioned on a surface of the first insulating layer.

12. The base of claim 1, wherein at least one of the first and second conductive layers comprises a substantially continuous conductive sheet.

13. An electronic system comprising an input device, an output device, a memory device, and a processor device coupled to the input, output, and memory devices, at least one of the input, output, memory, and processor devices comprising a base for supporting at least two bare integrated circuit dice facing the same direction, the base including:

a supporting substrate;

a conductive layer positioned on the supporting substrate and including a surface with at least one localized region thereon for direct conductive attachment by a conductive die-attachment material to a backside surface of at least one of the at least two bare integrated circuit dice;

at least one insulating layer positioned on the surface of the conductive layer, the at least one insulating layer having at least one aperture therethrough to further define the at least one localized region on the surface of the conductive layer for receiving at least one of the at least two bare integrated circuit dice;

at least one additional conductive layer positioned substantially parallel to and vertically-spaced apart from the conductive layer, the at least one additional conductive layer connected to the at least one insulating layer and including at least one other localized region thereon for direct conductive attachment by a conductive die-attachment material to a backside surface of at least one other of the at least two bare integrated circuit dice; and at least one additional insulating layer positioned on a surface of the at least one additional conductive layer, the at least one additional insulating layer having at least two other apertures therethrough, one of the at least two other apertures further defining the at least one other localized region on the surface of the at least one additional conductive layer and for receiving the at least one other die of the at least two bare integrated circuit dice, the other of the at least two other apertures being substantially vertically aligned and in communication with one of the at least two other apertures extending through the at least one additional conductive layer and with the at least one aperture extending through the at least one insulating layer to further define the at least one localized region of the conductive layer.

14. The electronic system of claim 13, wherein the memory device comprises a Dual In-Line Memory Module (DIMM).

15. The electronic system of claim 13, wherein the memory device comprises a Single In-Line Memory Module (SIMM).

16. The electronic system of claim 13, wherein the memory device comprises a memory card.

17. A semiconductor device assembly having at least two semiconductor dice facing the same direction, the semiconductor device assembly comprising: at least two conductive layers positioned substantially parallel to one another and vertically-spaced apart, each of the at least two conductive layers including at least one localized region thereon and each at least one localized region being vertically offset from each other;

at least one insulative layer positioned adjacently above each of the at least two conductive layers, at least one of each insulative layer having at least one aperture extending therethrough for further defining at least one the localized region located substantially vertically under each aperture, and at least one of the insulative layers having an additional aperture extending therethrough being substantially vertically aligned and in communication with at least one aperture in at least one other of the insulative layers to further define the at least one localized region in the at least one other insulative layers therebelow; and each of the at least two semiconductor dice respectively backside-attached by a conductive die-attach material to each of the at least one localized region of the at least two conductive layers.

* * * * *

UNITED STATES PATENT AND TRADEMARK OFFICE
CERTIFICATE OF CORRECTION

PATENT NO.        : 6,064,116
APPLICATION NO. : 08/870614
DATED                : May 16, 2000
INVENTOR(S)      : Salman Akram It is certified that error appears in the above-identified patent and that said Letters Patent is hereby corrected as shown below:

Title page,
Item [57], ABSTRACT,
Line 11, change "front-side" to -- front side --.

Column 1,
Line 15, change "IC's" to -- ICs --.
Line 23, change "(PCB's)" to -- (PCBs) --.
Lines 26, 33, 43, 51 and 56, change "PCB's" to -- PCBs --.
Line 27, after "tape-automated" delete the comma ",".
Line 52, change "PCB's" to -- PCBs -- (both occurrences).
Line 61, change "PCT's" to -- PCBs --.
Line 62, change "widely-utilized" to -- widely utilized -- and change "PCB's" to -- PCBs --.

Column 2,
Lines 1, 52, 58 and 61, change "multi-chip" to -- multichip --.
Line 17, change "vertically-separated" to -- vertically separated --.

Column 3,
Lines 2, 8, 15 and 25, change "multi-chip" to -- multichip --.
Lines 10, 28 and 43, before "base" insert -- insulative --.
Line 12, after "term" change "PCB" to -- "PCB" --.
Line 18, change "PCB's" to -- PCBs --.
Line 22, change "(SIMM's)" to -- (SIMMs) --.
Line 23, change "(DIMM's)" to -- (DIMMs) --.
Line 26, before "dice" insert -- integrated circuit --.
Line 40, change "vertically-superimposed" to -- vertically superimposed --.
Line 44, change "front- or active-side" to -- front or active side -- and before "dice" insert -- integrated circuit --.
Line 45, change "wire-bonded" to -- wire bonded --.
Line 59, change "front-side" to -- front side --.
Line 66, before "dice" insert -- integrated circuit --.

Column 4,
Lines 2, 3, 4 and 36, before "dice" insert -- integrated circuit --.
Lines 4 and 18, change "front-side" to -- front side --.
Line 12, before "layer" insert -- conductive --.
Line 14, before "dice" insert -- integrated circuit -- and after "dice" insert -- 22 --.
Lines 23 and 30, change "multi-chip" to -- multi chip --.
Line 26, before "reference" insert -- conductive --.

UNITED STATES PATENT AND TRADEMARK OFFICE
CERTIFICATE OF CORRECTION

PATENT NO. : 6,064,116
APPLICATION NO. : 08/870614
DATED : May 16, 2000
INVENTOR(S) : Salman Akram It is certified that error appears in the above-identified patent and that said Letters Patent is hereby corrected as shown below:

Column 4 (cont'd),
Lines 34 and 39, before "base" insert -- insulative --.
Line 50, change "front- or active-side" to -- front or active side -- and before "dice" insert -- integrated circuit --.

Column 5,
Lines 1, 2 and 5, before "dice" insert -- integrated circuit --.
Line 3, change "front-side" to -- front side --.
Line 6, change "$V_{bb\ 2}$" to -- $V_{bb2}$ --.
Line 7, change "$V_{bb}$" to -- $V_{bb1}$ --.
Lines 9, 12 and 16, change "multi-chip" to -- multichip --.

Column 6,
Line 7, change "front-side" to -- front side --.

Signed and Sealed this

Fourth Day of July, 2006

JON W. DUDAS
*Director of the United States Patent and Trademark Office*